US012439676B2

(12) United States Patent
Kikuchi et al.

(10) Patent No.: US 12,439,676 B2
(45) Date of Patent: Oct. 7, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takuo Kikuchi, Kamakura (JP); Tatsuya Nishiwaki, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 370 days.

(21) Appl. No.: 17/664,989

(22) Filed: May 25, 2022

(65) Prior Publication Data

US 2023/0090527 A1 Mar. 23, 2023

(30) Foreign Application Priority Data

Sep. 21, 2021 (JP) ................. 2021-153547

(51) Int. Cl.
| | | |
|---|---|---|
| H10D 64/27 | (2025.01) | |
| H01L 21/3105 | (2006.01) | |
| H10D 62/10 | (2025.01) | |

(52) U.S. Cl.
CPC ..... *H10D 64/514* (2025.01); *H01L 21/31053* (2013.01); *H10D 62/103* (2025.01); *H10D 64/513* (2025.01)

(58) Field of Classification Search
CPC ............. H01L 29/7811; H01L 29/7813; H01L 29/1095; H01L 29/4236; H01L 29/404;
(Continued)

(56) References Cited

U.S. PATENT DOCUMENTS

2003/0047776 A1 3/2003 Hueting et al.
2012/0326227 A1* 12/2012 Burke .................. H01L 29/407
438/270
(Continued)

FOREIGN PATENT DOCUMENTS

JP 2005-503021 A 1/2005
JP 2013-65719 A 4/2013
(Continued)

OTHER PUBLICATIONS

Japanese Office Action issued Nov. 14, 2024 in Japanese Patent Application No. 2021-153547, (with unedited computer-generated English translation), 11 pages.

*Primary Examiner* — Raj R Gupta
(74) *Attorney, Agent, or Firm* — Oblon, McClelland, Maier & Neustadt, L.L.P.

(57) ABSTRACT

A semiconductor device includes a semiconductor part, first to fourth electrodes, first and second insulating films. The semiconductor part includes a first layer of a first conductivity type and a second layer of a second conductivity type. The first and second electrodes are provided on back and front surfaces of the semiconductor part, respectively. The second layer is provided between the first layer and the second electrode. A plurality of the third electrodes extend into the first layer through the second layer. The fourth electrode extends into the first layer from the front side of the semiconductor part and surrounds the second layer. The first insulating film electrically insulates the third electrode from the semiconductor part. The second insulating film electrically insulates the fourth electrode from the semiconductor part. The second insulating film has a first thickness greater than a second thickness of the first insulating film.

21 Claims, 7 Drawing Sheets

(58) Field of Classification Search
CPC ............. H01L 29/407; H01L 29/42364; H01L 29/42376
See application file for complete search history.

(56) References Cited

U.S. PATENT DOCUMENTS

| | | |
|---|---|---|
| 2013/0207227 A1 | 8/2013 | Azam et al. |
| 2019/0296147 A1* | 9/2019 | Kawamura ....... H01L 29/66734 |
| 2020/0091338 A1 | 3/2020 | Nishiwaki |
| 2021/0288178 A1 | 9/2021 | Kikuchi et al. |
| 2022/0013647 A1* | 1/2022 | Ogura ................. H01L 29/7811 |

FOREIGN PATENT DOCUMENTS

| | | |
|---|---|---|
| JP | 2015-510696 A | 4/2015 |
| JP | 2019-145633 A | 8/2019 |
| JP | 2020-47742 A | 3/2020 |
| JP | 2021-34540 A | 3/2021 |
| JP | 2021-145046 A | 9/2021 |

\* cited by examiner

SEMICONDUCTOR DEVICE

CROSS-REFERENCE TO RELATED APPLICATIONS

This application is based upon and claims the benefit of priority from Japanese Patent Application No. 2021-153547, filed on Sep. 21, 2021; the entire contents of which are incorporated herein by reference.

FIELD

Embodiments relate to a semiconductor device.

BACKGROUND

It is desirable for a power control semiconductor device to have a high breakdown voltage.

DETAILED DESCRIPTION

Figure 1:
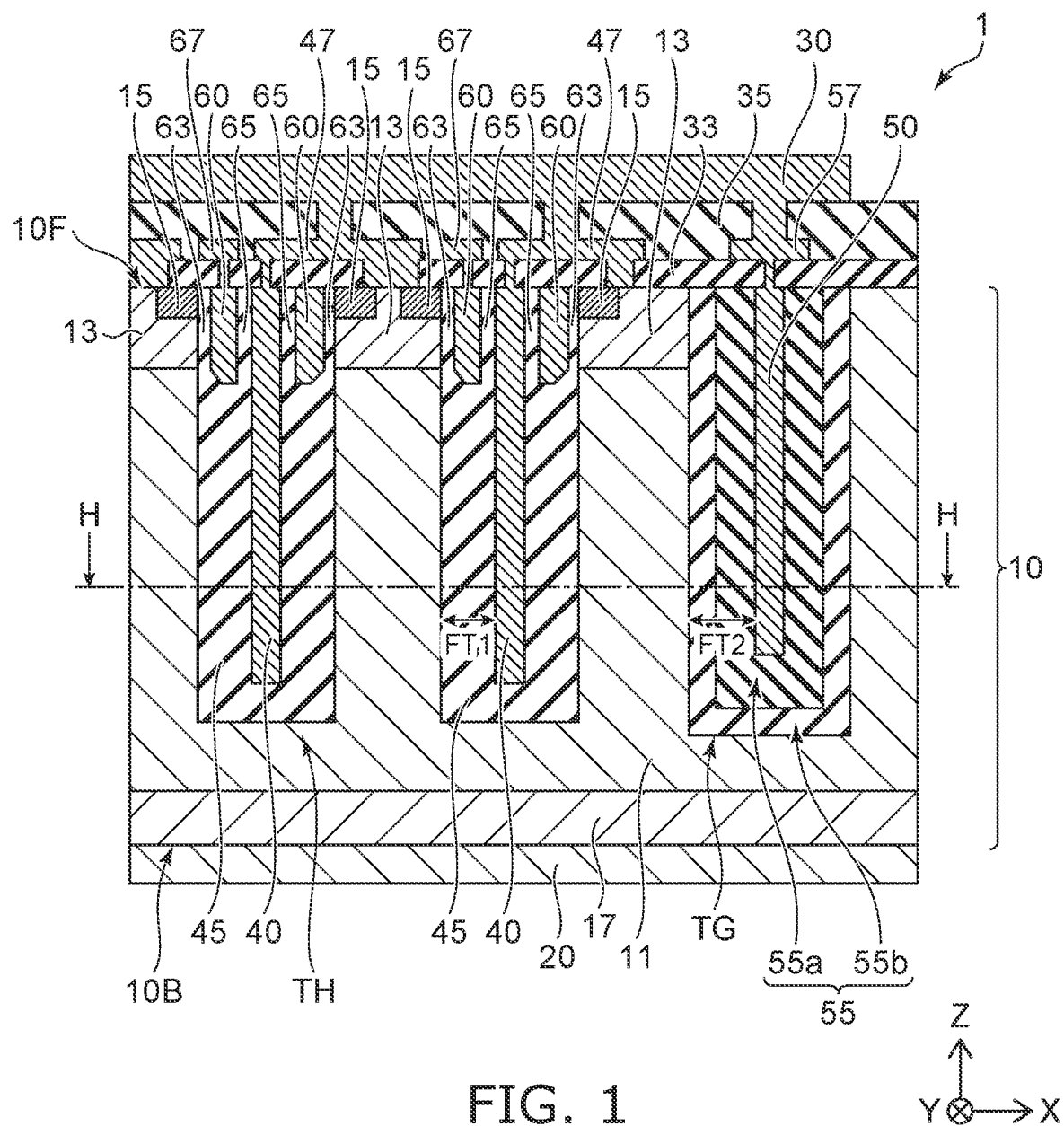
FIG. 1 is a schematic cross-sectional view showing a semiconductor device according to an embodiment.

According to one embodiment, a semiconductor device includes a semiconductor part, first to third electrodes and first and second insulating films. The semiconductor part includes a first semiconductor layer and a second semiconductor layer, the first semiconductor layer being of a first conductivity type, the second semiconductor layer being of a second conductivity type. The first electrode is provided on a back surface of the semiconductor part. The second electrode is provided at a front side of the semiconductor part. The first semiconductor layer extends between the first electrode and the second electrode. The second semiconductor layer is provided between the first semiconductor layer and the second electrode. The second semiconductor layer is electrically connected to the second electrode. A plurality of the third electrodes extends into the first semiconductor layer from the front side of the semiconductor part through the second semiconductor layer. The third electrodes are apart from each other in a direction along the back surface of the semiconductor part. The third electrodes are electrically connected to the second electrode. The fourth electrode extends into the first semiconductor layer from the front side of the semiconductor part. The fourth electrode surrounds the second semiconductor layer and is electrically connected to the second electrode. The first insulating film is provided between the semiconductor part and the third electrode. The first insulating film electrically insulates the third electrode from the semiconductor part. The second insulating film is provided between the semiconductor part and the fourth electrode. The second insulating film electrically insulates the fourth electrode from the semiconductor part. The second insulating film has a first film thickness greater than a second film thickness of the first insulating film.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. FIG. 1 is a cross-sectional view along line V-V shown in FIG. 2A. The semiconductor device 1 is, for example, a MOSFET.

As shown in FIG. 1, the semiconductor device 1 includes a semiconductor part 10, a first electrode 20, a second electrode 30, a third electrode 40, a fourth electrode 50, and a control electrode 60. The semiconductor part 10 is, for example, silicon.

The first electrode 20 is provided on a back surface 10B of the semiconductor part 10. The first electrode 20 is, for example, a drain electrode. The first electrode 20 is, for example, a metal layer that includes nickel (Ni), aluminum (Al), etc.

The second electrode 30 is provided at a front surface 10F side of the semiconductor part 10. The second electrode 30 is, for example, a source electrode. The second electrode 30 is, for example, a metal layer that includes titanium nitride (TiN), tungsten (W), aluminum (Al), etc.

The third electrode 40 is provided inside a trench TH that is provided in the front side of the semiconductor part 10. For example, the trench TH has a circular or polygonal opening, and is a hole that extends in the direction directed from the front side toward the back surface of the semiconductor part 10 (e.g., a −Z direction).

The third electrode 40 is electrically insulated from the semiconductor part 10 by a first insulating film 45. The first insulating film 45 covers the inner surface of the trench TH and is provided between the semiconductor part 10 and the third electrode 40. The first insulating film 45 is, for example, a silicon oxide film.

The fourth electrode 50 is provided inside a trench TG that is provided in the front side of the semiconductor part 10. For example, the trench TG extends in the direction directed from the front side toward the back surface of the semiconductor part 10 (e.g., the −Z direction). The trench TG is provided with a trench shape that surrounds the region in which the multiple third electrodes 40 are provided (see FIG. 2A). The fourth electrode 50 extends along the opening of the trench TG and surrounds the region in which the multiple third electrodes 40 are provided.

The fourth electrode 50 is electrically insulated from the semiconductor part 10 by a second insulating film 55. The second insulating film 55 covers the inner surface of the trench TG and is provided between the semiconductor part 10 and the fourth electrode 50. The second insulating film 55 is, for example, a silicon oxide film. The second insulating film 55 has a film thickness FT2 that is greater than a film thickness FT1 of the first insulating film 45.

The second insulating film 55 has, for example, a two-layer structure that includes a first layer 55a and a second layer 55b. The first layer 55a is provided between the semiconductor part 10 and the fourth electrode 50. The second layer 55b is provided between the semiconductor part 10 and the first layer 55a.

Embodiments are not limited to the examples described above. For example, the first layer 55a may include a different material from the second layer 55b. The first layer 55a includes, for example, silicon nitride when the second layer 55b includes silicon oxide.

The control electrode 60 is provided, for example, in the trench TH between the semiconductor part 10 and the third electrode 40. The control electrode 60 is, for example, a gate electrode. The control electrode 60 is provided in the upper portion of the trench TH. For example, the upper surface of the control electrode 60 is positioned at the vicinity of the opening of the trench TH.

The control electrode 60 is electrically insulated from the semiconductor part 10 by a third insulating film 63. The third insulating film 63 is, for example, a gate insulating film. The third insulating film 63 covers the upper portion of the inner surface of the trench TH and is provided between the semiconductor part 10 and the control electrode 60. The third insulating film 63 is, for example, a silicon oxide film.

For example, the control electrode 60 surrounds the third electrode 40 in a plane parallel to the front surface 10F of the semiconductor part 10. The control electrode 60 is electrically insulated from the third electrode 40 by a fourth insulating film 65. The fourth insulating film 65 is provided between the third electrode 40 and the control electrode 60. The fourth insulating film 65 is, for example, a silicon oxide film.

The control electrode 60 is provided in the trench TG such that a first distance from the first electrode 20 to the third electrode 40 is less than a second distance from the first electrode 20 to the control electrode 60.

The semiconductor part 10 includes, for example, a first semiconductor layer 11 of a first conductivity type, a second semiconductor layer 13 of a second conductivity type, a third semiconductor layer 15 of the first conductivity type, and a fourth semiconductor layer 17 of the first conductivity type. Hereinbelow, the first conductivity type is described as an n-type; and the second conductivity type is described as a p-type.

The first semiconductor layer 11 extends between the first electrode 20 and the second electrode 30. The first semiconductor layer 11 is, for example, an n-type drift layer. The trench TH and the trench TG each extend in the first semiconductor layer 11 from the front side of the semiconductor part 10. The third electrode 40 faces the first semiconductor layer 11 via the first insulating film 45. The fourth electrode 50 faces the first semiconductor layer 11 via the second insulating film 55.

The second semiconductor layer 13 is provided between the first semiconductor layer 11 and the second electrode 30. The second semiconductor layer 13 is, for example, a p-type diffusion layer. The second semiconductor layer 13 faces the control electrode 60 via the third insulating film 63.

Figure 2A:
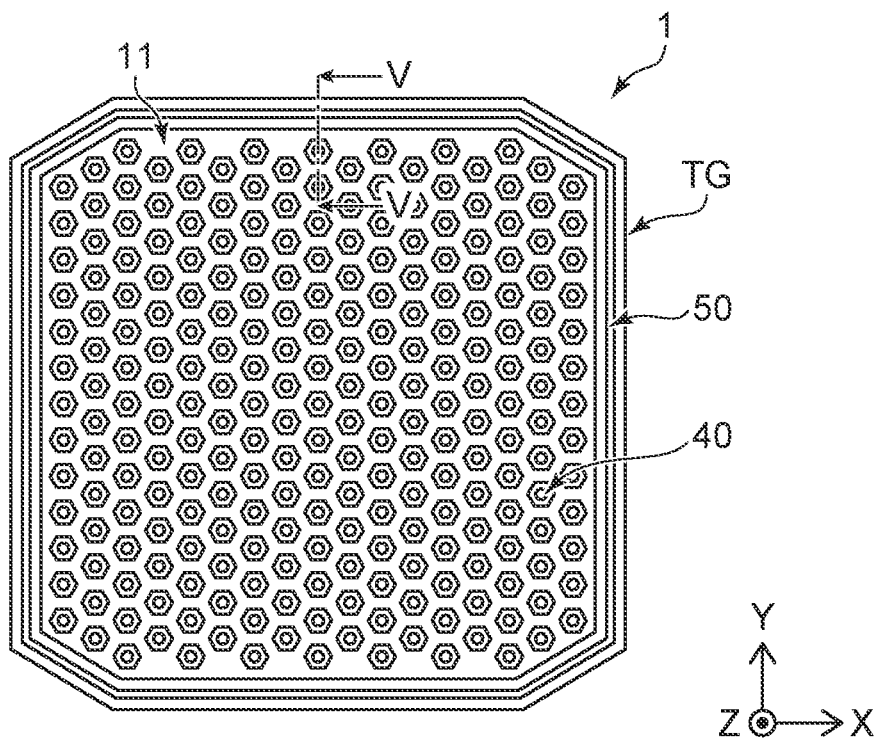
FIGS. 2A and 2B are schematic plan views showing the semiconductor device according to the embodiment.
Figure 2B:
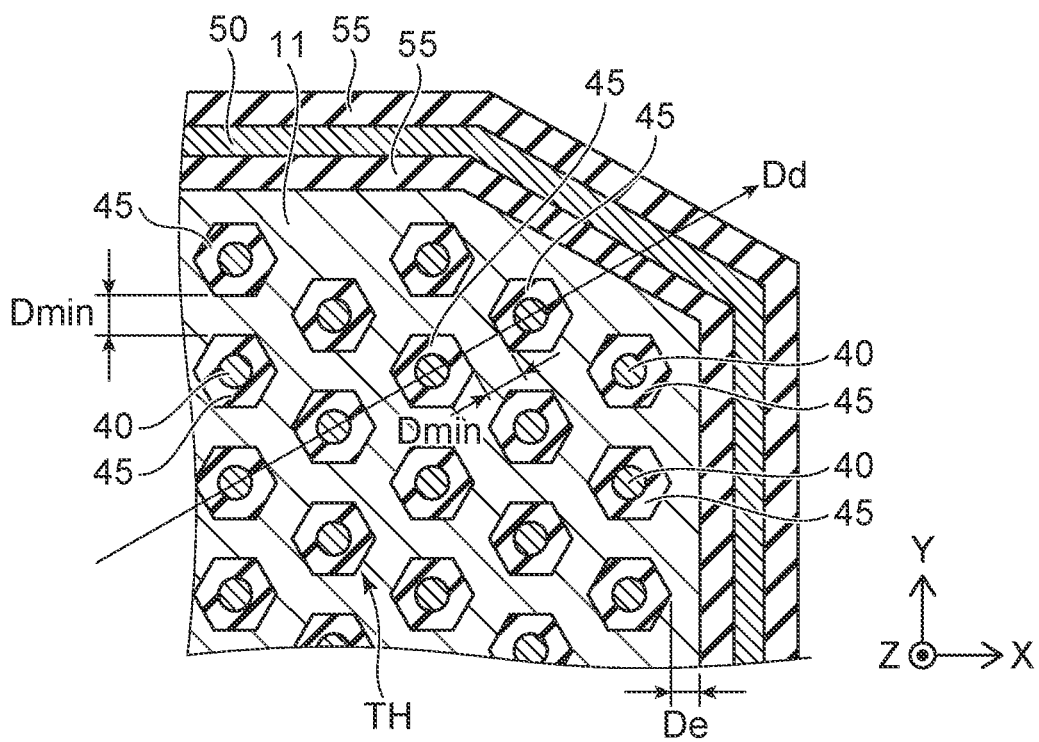

The fourth electrode 50 surrounds the region of the semiconductor part 10 in which the second semiconductor layer 13 is provided (see FIGS. 2A and 2B). The fourth electrode 50 faces the second semiconductor layer 13 via the second insulating film 55.

The third semiconductor layer 15 is partially provided between the second semiconductor layer 13 and the second electrode 30. The third semiconductor layer 15 contacts the third insulating film 63. The third semiconductor layer 15 is, for example, an n-type source layer.

The fourth semiconductor layer 17 is provided between the first semiconductor layer 11 and the first electrode 20. The fourth semiconductor layer 17 includes a first-conductivity-type impurity with a higher concentration than a concentration of a first-conductivity-type impurity in the first semiconductor layer 11. The fourth semiconductor layer 17 is, for example, an n-type drain layer. The first electrode 20 is electrically connected to the fourth semiconductor layer 17.

The semiconductor device 1 further includes a fifth insulating film 33, a sixth insulating film 35, a first interconnect 47, a second interconnect 57, and a third interconnect 67.

The fifth insulating film 33 and the sixth insulating film 35 are provided between the semiconductor part 10 and the second electrode 30. The fifth insulating film 33 is provided between the semiconductor part 10 and the sixth insulating film 35. The sixth insulating film 35 is provided between the fifth insulating film 33 and the second electrode 30. The fifth insulating film 33 and the sixth insulating film 35 are, for example, inter-layer insulating films. The fifth insulating film 33 and the sixth insulating film 35 are, for example, silicon oxide films.

The fifth insulating film 33 covers the trench TG, the trench TH, and the front surface 10F of the semiconductor part 10. The first interconnect 47, the second interconnect 57, and the third interconnect 67 are provided between the fifth insulating film 33 and the sixth insulating film 35.

The first interconnect 47 is electrically connected to the third electrode 40 via a contact hole provided in the fifth insulating film 33. The second interconnect 57 is electrically connected to the fourth electrode 50 via another contact hole provided in the fifth insulating film 33. The third interconnect 67 is electrically connected to the control electrode 60 via yet another contact hole provided in the fifth insulating film 33. The first interconnect 47 also is electrically connected to the second and third semiconductor layers 13 and 15 via other contact hole provided in the fifth insulating film 33.

The second electrode 30 is connected to the first and second interconnects 47 and 57 via contact holes provided in the sixth insulating film 35. Thus, the third electrode 40 and the fourth electrode 50 are electrically connected to the second electrode 30. The second semiconductor layer 13 and the third semiconductor layer 15 also are electrically connected to the second electrode 30.

FIGS. 2A and 2B are schematic plan views showing the semiconductor device 1 according to the embodiment. FIG. 2A is a cross-sectional view along line H-H shown in FIG. 1. FIG. 2B is a partial cross-sectional view showing a portion of FIG. 2A.

As shown in FIG. 2A, the trench TG surrounds the region of the semiconductor part 10 in which the multiple third electrodes 40 are provided. The outer edge of the trench TG is, for example, a quadrilateral of which the four corners are beveled. The fourth electrode 50 extends along the trench TG and surrounds the multiple third electrodes 40. The third electrodes 40 have, for example, columnar shapes extending in the Z-direction. The fourth electrode 50 has, for example, a plate shape extending in the Z-direction and in directions parallel to the back surface 10B of the semiconductor part 10.

For example, the third electrodes 40 are arranged in the Y-direction. Multiple columns of the third electrodes 40 arranged in the Y-direction are arranged in the X-direction. For example, one of the third electrodes 40 is provided adjacent in the X-direction to the space between the third electrodes 40 adjacent to each other in the Y-direction.

FIG. 2B is a plan view showing one corner of the trench TG. As shown in FIG. 2B, for example, the trench TH has a regular hexagonal cross-sectional shape. For example, the third electrode 40 is located at the center of the regular hexagon.

The multiple third electrodes 40 are provided so that the spacing between the two first insulating films 45 adjacent to each other in the Y-direction is a minimum spacing Dmin. Also, the multiple third electrodes 40 are provided so that the spacing between the two first insulating films 45 adjacent to each other in an oblique direction Dd crossing the X-direction and the Y-direction is the minimum spacing Dmin.

One of the four corners of the trench TG is parallel to the oblique direction Dd in the X-Y cross-sectional plan. The fourth electrode that is provided inside the trench TG includes a first portion extending in the X-direction, a second portion extending in the oblique direction, and a third portion extending in the Y-direction.

The multiple third electrodes 40 include, for example, three third electrodes 40 that are most proximate to the second portion of the fourth electrode 50. The three third electrodes 40 that are most proximate to the second portion of the fourth electrode 50 are arranged along the second portion of the fourth electrode 50. Embodiments are not limited to such examples; for example, at least two third electrodes 40 may be most proximate to the second portion of the fourth electrode 50 and may be arranged along the second portion of the fourth electrode 50.

Moreover, a spacing De between the trench TG and the trenches TH arranged along the trench TG is a uniform spacing. The spacing De is, for example, equal to the minimum spacing Dmin.

A method for manufacturing the semiconductor device 1 will now be described with reference to FIGS. 3A to 5B. FIGS. 3A to 5B are schematic cross-sectional views showing manufacturing processes of the semiconductor device 1 according to the embodiment.

Figure 3A:
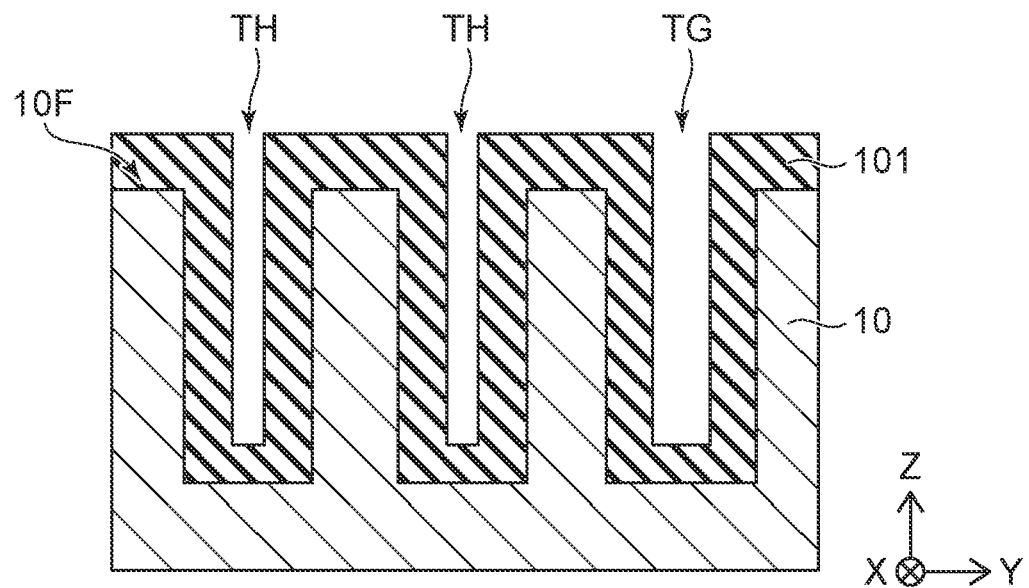
FIGS. 3A to 5B are schematic cross-sectional views showing manufacturing processes of the semiconductor device according to the embodiment.

As shown in FIG. 3A, an insulating film 101 is formed after forming the trenches TH and TG in the front surface 10F side of the semiconductor part 10. In such a case, the semiconductor part 10 is, for example, an n-type silicon wafer.

The trenches TH and TG are formed by, for example, selectively removing the semiconductor part 10 using an etching mask (not illustrated). For example, the trenches TH and TG are formed using anisotropic RIE (Reactive Ion Etching).

The insulating film 101 covers the inner surfaces of the trenches TH and TG so that spaces remain inside the trenches TH and TG. The insulating film 101 is formed by, for example, thermal oxidation of the semiconductor part 10. The insulating film 101 is, for example, a silicon oxide film.

Figure 3B:
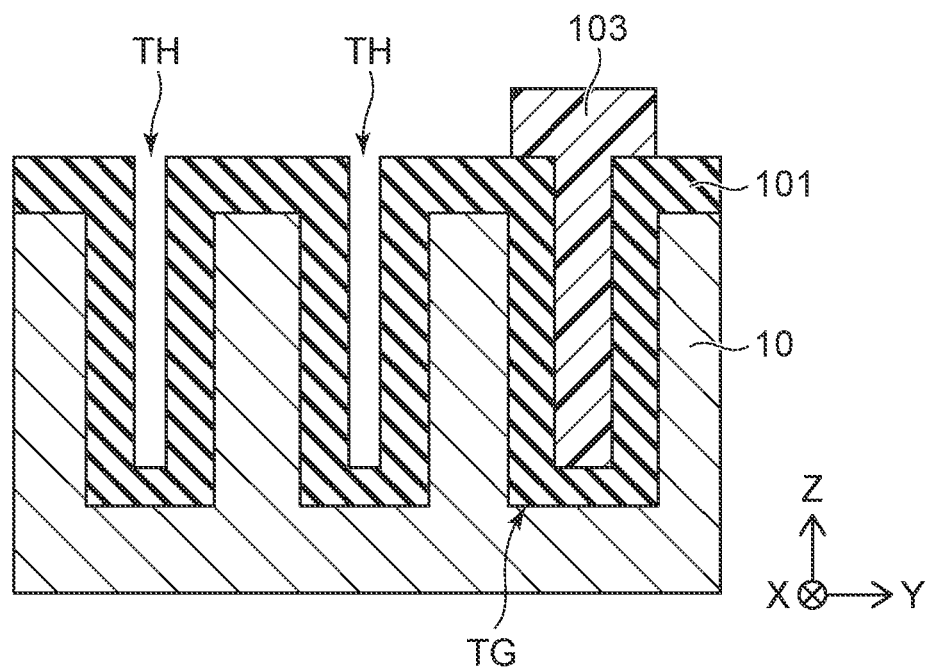

As shown in FIG. 3B, a resist mask 103 is formed to fill the space in the trench TG and to cover the opening of the trench TG. The trench TH is exposed at the front side of the semiconductor part 10. The resist mask 103 is formed using, for example, photolithography.

Figure 4A:
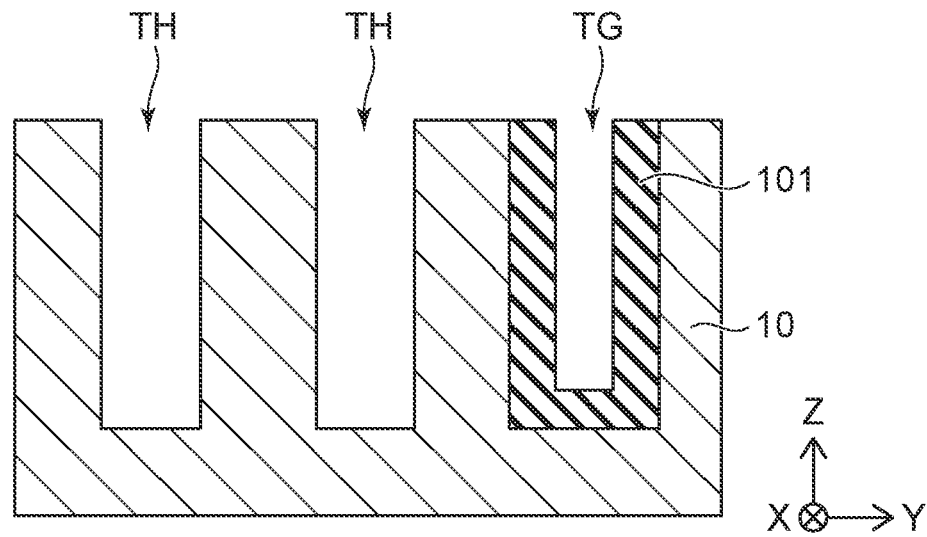

As shown in FIG. 4A, the insulating film 101 is selectively removed by etching. The insulating film 101 is selectively removed using the resist mask 103. The insulating film 101 is removed using, for example, wet etching. The resist mask 103 is removed after selectively etching the insulating film 101.

Figure 4B:
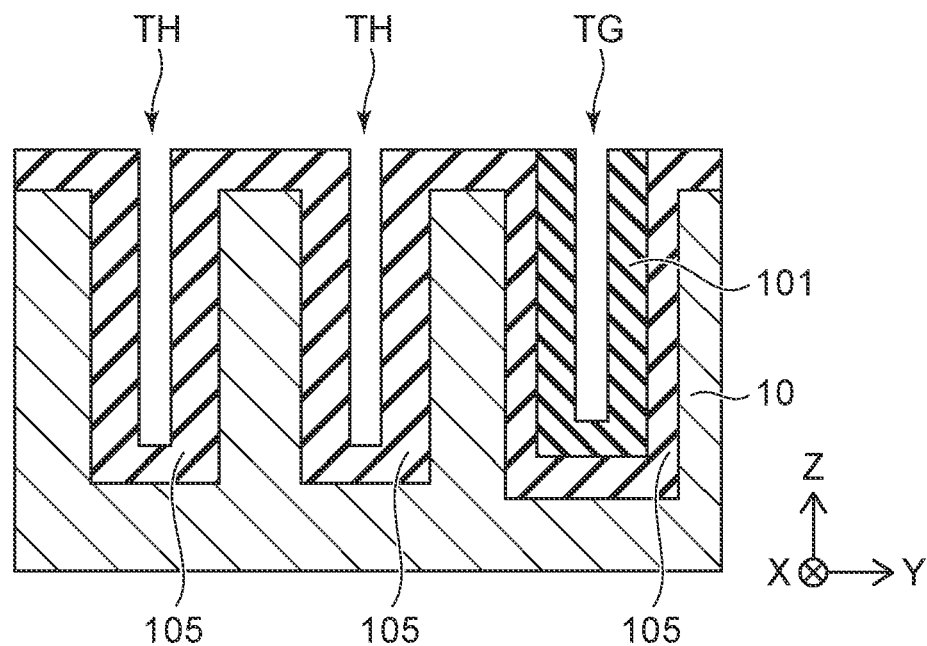

As shown in FIG. 4B, an insulating film 105 is formed on the inner surface of the trench TH and between the insulating film 101 and the semiconductor part 10. The insulating film 105 is formed by re-performing thermal oxidation of the semiconductor part 10. Inside the trench TG, thermal oxidation of the semiconductor part 10 is performed via the insulating film 101. The insulating film 105 is formed so that spaces remain inside the trenches TH and TG. The insulating film 105 is, for example, a silicon oxide film.

Figure 5A:
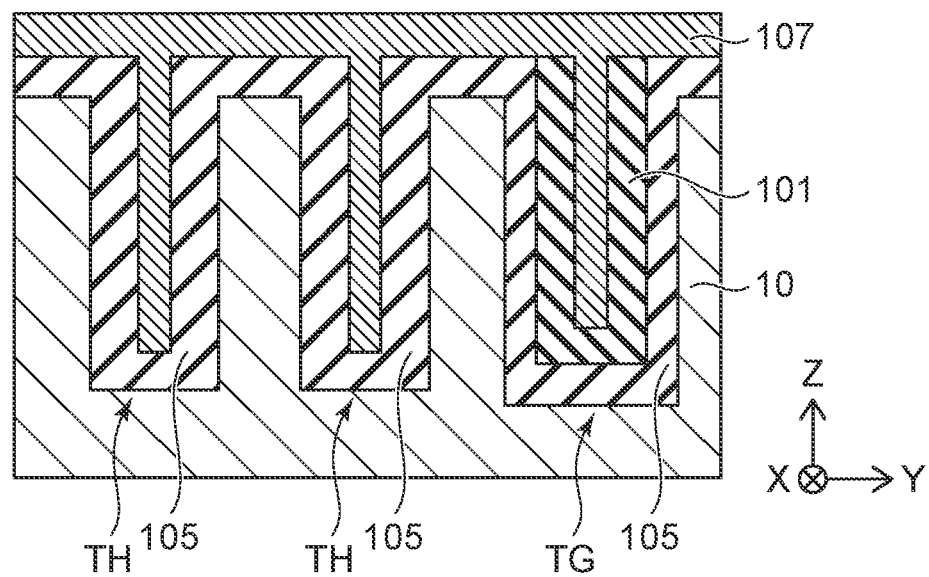

As shown in FIG. 5A, a conductive film 107 is formed to fill the spaces inside the trenches TH and TG. The conductive film 107 is, for example, polysilicon that is conductive. The conductive film 107 is formed using, for example, CVD (Chemical Vapor Deposition).

Figure 5B:
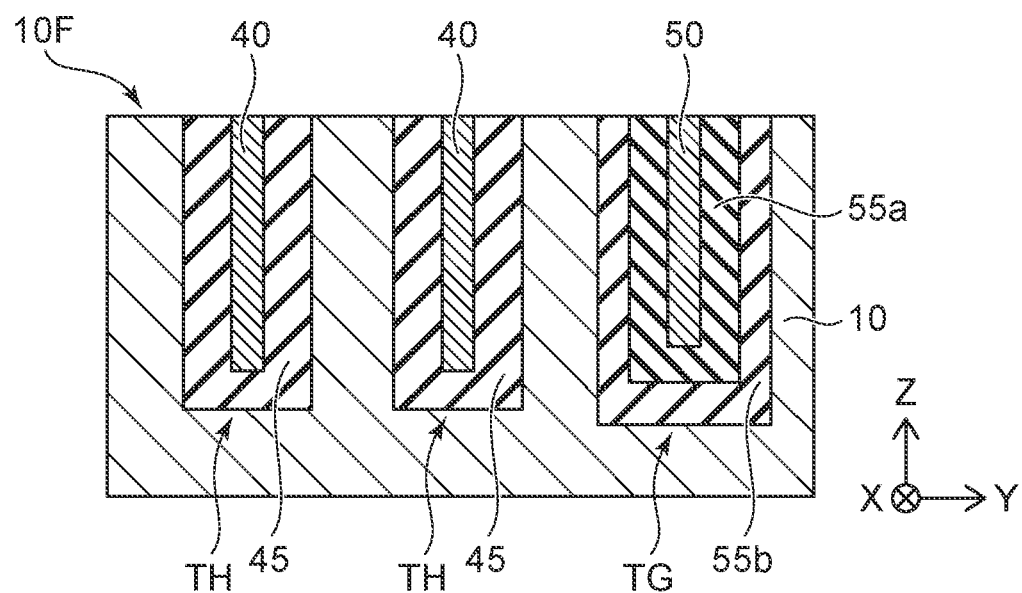

As shown in FIG. 5B, the insulating film 105 and the conductive film 107 that are on the front surface 10F of the semiconductor part 10 are removed. The insulating film 105 and the conductive film 107 are removed using, for example, isotropic dry etching or CMP (Chemical Mechanical Polishing).

Continuing, the second semiconductor layer 13, the third semiconductor layer 15, the control electrode 60, the first to third interconnects, and the second electrode 30 are formed at the front side of the semiconductor part 10 (see FIG. 1). The fourth semiconductor layer 17 and the first electrode 20 are formed at the backside of the semiconductor part 10 (see FIG. 1); and the semiconductor device 1 is completed.

Figure 6A:
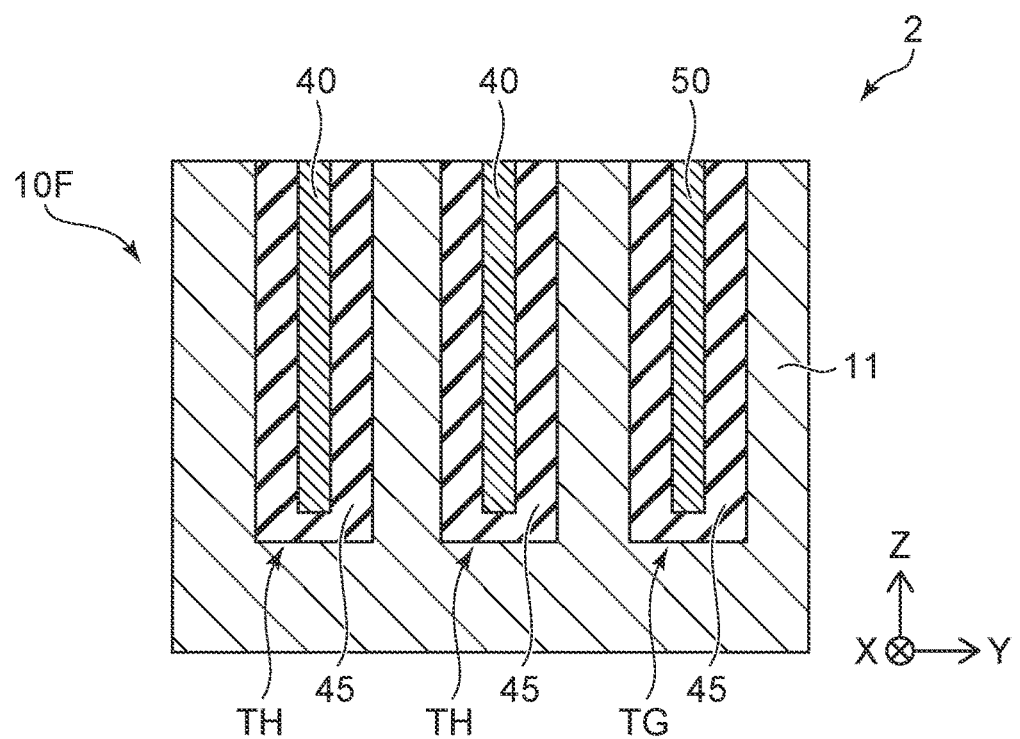
FIGS. 6A and 6B are schematic views showing characteristics of a semiconductor device according to a comparative example.
Figure 6B:
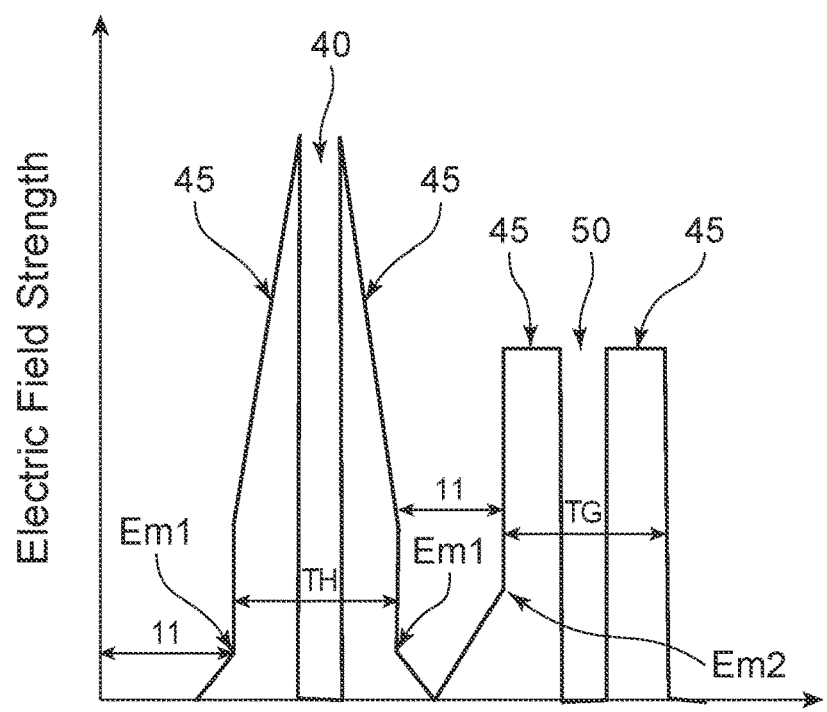

FIGS. 6A and 6B are schematic views showing characteristics of a semiconductor device 2 according to a comparative example. FIG. 6A is a cross-sectional view showing the semiconductor device 2. FIG. 6B is a graph showing the electric field strength distribution of semiconductor device 2 at the turn-off state. The horizontal axis is the position in the horizontal direction (the Y-direction). The vertical axis is the electric field strength.

As shown in FIG. 6A, in the semiconductor device 2, the first insulating film 45 is provided between the first semiconductor layer 11 and the third electrode 40 and between the first semiconductor layer 11 and the fourth electrode 50. In other words, the film thickness of the insulating film between the first semiconductor layer and the third electrode 40 is equal to the film thickness of another insulating film between the first semiconductor layer 11 and the fourth electrode 50.

As shown in FIG. 6B, the electric field distribution in the first insulating films 45 inside the trenches TH is different from the electric field distribution in another insulating films 45 inside the trenches TG due to the planar shape difference between the trench TH and the trench TG. Therefore, electric field strengths Em1 and Em2 at the interfaces between the first semiconductor layer 11 and the first insulating films 45 are different. The electric field strength Em1 is, for example, the electric field value at the interface between the first semiconductor layer 11 and the trench TH that has a hole configuration extending in the Z-direction. The electric field strength Em2 is, for example, the electric field value at the interface between the first semiconductor layer 11 and the trench TG that has trench-shape.

As shown in FIG. 6B, the electric field strength Em2 is greater than the electric field strength Em1. Therefore, in the semiconductor device 2, the electric field strength Em2 easily becomes large in the termination region that surrounds the region in which the multiple third electrodes 40 are provided, and avalanche breakdown easily occurs in the termination region. In other words, the breakdown voltage of the termination region is reduced.

Figure 7A:
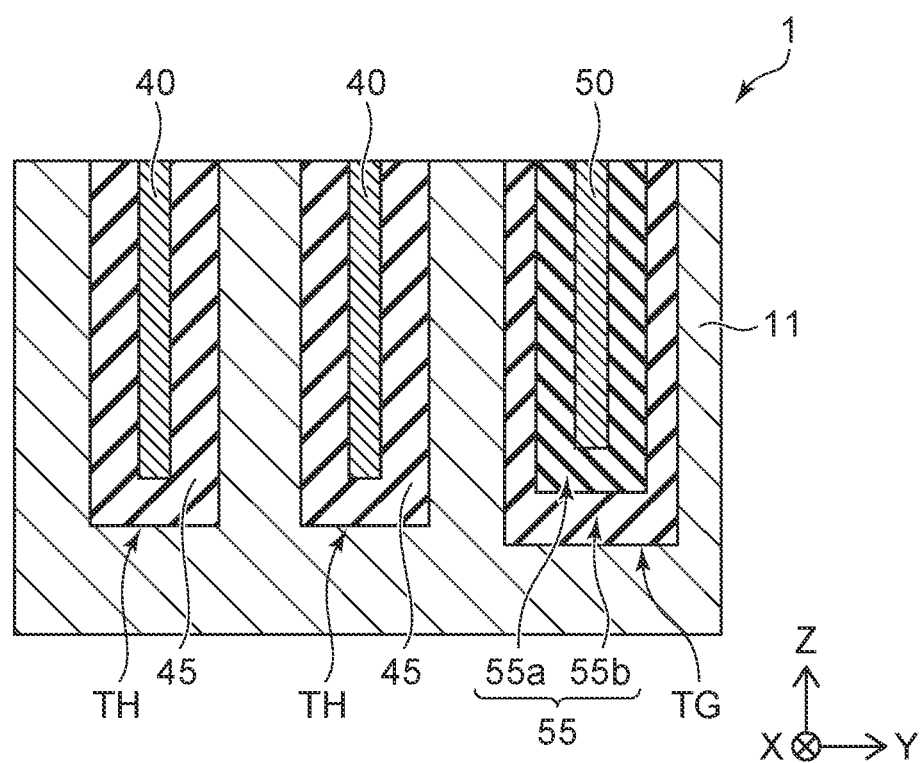
FIGS. 7A and 7B are schematic views showing characteristics of the semiconductor device according to the embodiment.
Figure 7B:
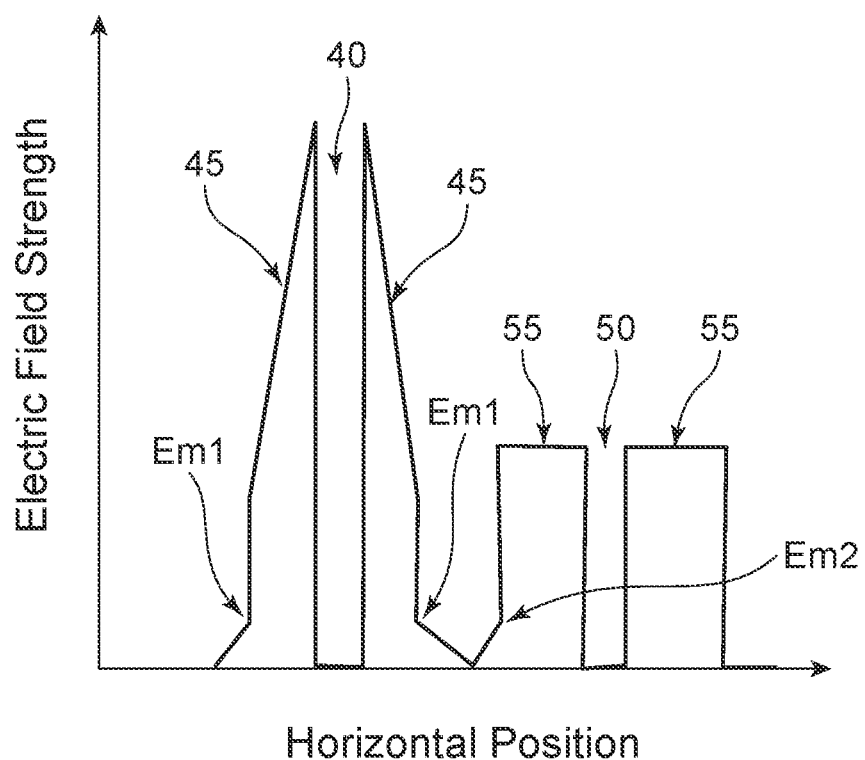

FIGS. 7A and 7B are schematic views showing characteristics of the semiconductor device 1 according to the embodiment. FIG. 7A is a cross-sectional view showing the semiconductor device 1. FIG. 7B is a graph showing the electric field strength distribution of the semiconductor device 1 at the turn-off state. The horizontal axis is the position in the horizontal direction (the Y-direction). The vertical axis is the electric field strength.

As shown in FIG. 7A, in the semiconductor device 1, the film thickness of the second insulating film 55 provided between the first semiconductor layer 11 and the fourth electrode 50 is greater than the film thickness of the first insulating film 45 provided between the first semiconductor layer 11 and the third electrode 40. Therefore, the electric field strength Em2 at the interface between the first semiconductor layer 11 and the second insulating film 55 can be set to be equal to or less than the electric field strength Em1 at the interface between the first semiconductor layer 11 and the first insulating film 45. In other words, the breakdown voltage can be increased in the termination region that surrounds the region in which the multiple third electrodes 40 are provided. As a result, the semiconductor device 1 has a higher breakdown voltage than the semiconductor device 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part including a first semiconductor layer and a second semiconductor layer, the first semiconductor layer being of a first conductivity type, the second semiconductor layer being of a second conductivity type;
a first electrode provided on a back surface of the semiconductor part;
a second electrode provided at a front side of the semiconductor part, the first semiconductor layer extending between the first electrode and the second electrode, the second semiconductor layer being provided between the first semiconductor layer and the second electrode, the second semiconductor layer being electrically connected to the second electrode;
a plurality of third electrodes extending into the first semiconductor layer from the front side of the semiconductor part through the second semiconductor layer, the third electrodes being apart from each other in a direction along the back surface of the semiconductor part, the third electrodes being electrically connected to the second electrode;
a fourth electrode extending into the first semiconductor layer from the front side of the semiconductor part, the fourth electrode surrounding the plurality of third electrodes in a plane parallel to the back surface, the fourth electrode being electrically connected to the second electrode;
a first insulating film provided between the semiconductor part and the third electrode, the first insulating film electrically insulating each of the third electrodes from the semiconductor part; and
a second insulating film provided between the semiconductor part and the fourth electrode, the second insulating film electrically insulating the fourth electrode from the semiconductor part, the second insulating film having a second film thickness greater than a first film thickness of the first insulating film,
wherein the first insulating film physically contacts the first semiconductor layer and the third electrode, and
the second insulating film physically contacts the first semiconductor layer and the fourth electrode.

2. The device according to claim 1, wherein
the second insulating film includes a first layer and a second layer, the first layer being provided between the semiconductor part and the fourth electrode, the second layer being provided between the semiconductor part and the first layer.

3. The device according to claim 2, wherein
the first layer of the second insulating film includes a same material as a material of the first insulating film.

4. The device according to claim 1, wherein
the semiconductor part is silicon,
the first insulating film is a silicon oxide film, and
the second insulating film has a two-layer structure including a silicon oxide layer and a silicon nitride layer.

5. The device according to claim 2, wherein
the first layer of the second insulating film includes a same material as a material of the second layer.

6. The device according to claim 1, wherein
the semiconductor part is silicon, and
the first insulating film and the second insulating film are silicon oxide films.

7. The device according to claim 1, wherein
the third electrode has a columnar shape extending in a direction directed from the first electrode toward the second electrode.

8. The device according to claim 1, wherein
the fourth electrode has a plate-shape extending in a direction directed from the first electrode toward the second electrode and another direction parallel to the back surface of the semiconductor part.

9. The device according to claim 1, wherein
the second semiconductor layer contacts the second insulating film and faces the fourth electrode through the second insulating film.

10. The device according to claim 9, wherein
the fourth electrode further faces the first semiconductor layer via the second insulating film.

11. The device according to claim 1, further comprising:
a control electrode provided between the second semiconductor layer and each of the third electrode;
a third insulating film provided between the second semiconductor layer and the control electrode; and
a fourth insulating film provided between each of the third electrodes and the control electrode.

12. The device according to claim 11, wherein
a first distance from the first electrode to the third electrodes is less than a second distance from the first electrode to the control electrode, and the third electrode faces the first semiconductor layer via the first insulating film.

13. The device according to claim 11, wherein
the semiconductor part further includes a third semiconductor layer of the first conductivity type, and
the third semiconductor layer contacts the third insulating film and is partially provided on the second semiconductor layer between the second semiconductor layer and the second electrode.

14. The device according to claim 11, further comprising:
a fifth insulating film provided between the semiconductor part and the second electrode;
a sixth insulating film provided between the fifth insulating film and the second electrode;
a first interconnect provided between the fifth insulating film and the sixth insulating film and electrically connected to the second and third electrodes;
a second interconnect provided between the fifth insulating film and the sixth insulating film and electrically connected to the second and fourth electrodes; and
a third interconnect provided between the fifth insulating film and the sixth insulating film and electrically connected to the control electrode.

15. The device according to claim 14, wherein
the first interconnect also is electrically connected to the second semiconductor layers.

16. The device according to claim 1, wherein
the plurality of third electrodes are arranged in a first direction, a second direction and a third direction in the plane parallel to the back surface of the semiconductor part, the first direction being orthogonal to the third direction, the second direction crossing the first direction and a third direction, and
the arrangement of the third electrodes has a minimum spacing between two third electrodes of the plurality of third electrodes adjacent to each other in the first direction and between another two third electrodes of the plurality of third electrodes adjacent to each other in the second direction.

17. The device according to claim 16, wherein
the fourth electrode includes first to third portions, the first portion extending in the first direction, the second portion extending in the second direction, the third portion extending in the third direction.

18. The device according to claim 17, wherein
the plurality of third electrodes includes at least two third electrodes most proximate to the second portion of the fourth electrode, and
the at least two third electrodes are arranged along the second portion of the fourth electrode.

19. The device according to claim 16, wherein
the arrangement of the third electrodes provides a uniform spacing between the second insulating film and the first insulating film adjacent to the second insulating film with the most proximate distance.

20. The device according to claim 19, wherein
the most proximate distance between the first insulating film and the second insulating film is equal to the minimum spacing of the first insulating films between the two adjacent third electrodes.

21. A semiconductor device, comprising:
a semiconductor part including a first semiconductor layer and a second semiconductor layer, the first semiconductor layer being of a first conductivity type, the second semiconductor layer being of a second conductivity type;
a first electrode provided on a back surface of the semiconductor part;
a second electrode provided at a front side of the semiconductor part, the first semiconductor layer extending between the first electrode and the second electrode, the second semiconductor layer being provided between the first semiconductor layer and the second electrode, the second semiconductor layer being electrically connected to the second electrode;
a plurality of third electrodes extending into the first semiconductor layer from the front side of the semiconductor part through the second semiconductor layer, the third electrodes being apart from each other in a direction along the back surface of the semiconductor part, the third electrodes being electrically connected to the second electrode;
a fourth electrode extending into the first semiconductor layer from the front side of the semiconductor part, the fourth electrode surrounding the second semiconductor layer, the fourth electrode being electrically connected to the second electrode;
a first insulating film provided between the semiconductor part and the third electrode, the first insulating film electrically insulating each of the third electrodes from the semiconductor part; and
a second insulating film provided between the semiconductor part and the fourth electrode, the second insulating film electrically insulating the fourth electrode from the semiconductor part, the second insulating film having a second film thickness greater than a first film thickness of the first insulating film,
wherein a first distance between the first electrode and the third electrode along a crossing direction perpendicular to the back surface is shorter than a second distance between the first electrode and the fourth electrode along the crossing direction.

* * * * *